United States Patent
Qu et al.

(10) Patent No.: US 11,670,646 B2
(45) Date of Patent: Jun. 6, 2023

(54) DISPLAY SUBSTRATE, PREPARATION METHOD THEREOF AND DISPLAY DEVICE

(71) Applicant: BOE Technology Group Co., Ltd., Beijing (CN)

(72) Inventors: Caiyu Qu, Beijing (CN); Fangxu Cao, Beijing (CN); Yanjun Hao, Beijing (CN); Huijuan Zhang, Beijing (CN); Yibing Fan, Beijing (CN); Zunqing Song, Beijing (CN); Dengyun Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 66 days.

(21) Appl. No.: 17/194,398

(22) Filed: Mar. 8, 2021

(65) Prior Publication Data

US 2022/0020782 A1    Jan. 20, 2022

(30) Foreign Application Priority Data

Jul. 20, 2020  (CN) .......................... 202010702007.3

(51) Int. Cl.
*H01L 29/786* (2006.01)
*H01L 27/12* (2006.01)

(52) U.S. Cl.
CPC ...... *H01L 27/1244* (2013.01); *H01L 27/1237* (2013.01); *H01L 27/1259* (2013.01)

(58) Field of Classification Search
CPC ............. H01L 27/1244; H01L 27/1237; H01L 27/1259; H01L 27/124; H01L 27/1218
See application file for complete search history.

(56) References Cited

U.S. PATENT DOCUMENTS

| | | |
|---|---|---|
| 5,777,702 A | 7/1998 | Wakagi et al. |
| 2009/0114921 A1 | 5/2009 | Yamazaki et al. |
| 2013/0285044 A1 | 10/2013 | Yuan et al. |
| 2015/0200113 A1* | 7/2015 | Kishida ............... H01L 27/1248 438/104 |
| 2017/0170206 A1* | 6/2017 | Lee ........................ H01L 51/52 |
| 2017/0358641 A1 | 12/2017 | Park et al. |

(Continued)

FOREIGN PATENT DOCUMENTS

| | | |
|---|---|---|
| CN | 1153313 A | 7/1997 |
| CN | 101425544 A | 5/2009 |

(Continued)

OTHER PUBLICATIONS

China National Intellectual Property Administration, First office action of Chinese application No. 202010702007.3 dated Mar. 30, 2022, which is foreign counterpart application of this US application.

(Continued)

*Primary Examiner* — Samuel Park
(74) *Attorney, Agent, or Firm* — Lippes Mathias LLP

(57) ABSTRACT

Provided are a display substrate, a preparation method thereof, and a display device. The display substrate includes: a substrate, a thin film transistor disposed in a pixel island region of the substrate, a first signal line disposed in the pixel island region and a first connecting bridge disposed in a bridge region of the substrate, wherein the first connecting bridge is electrically connected to a gate of the thin film transistor.

11 Claims, 3 Drawing Sheets

(56) References Cited

U.S. PATENT DOCUMENTS

| | | |
|---|---|---|
| 2019/0107911 A1 | 4/2019 | Zhai |
| 2019/0280077 A1* | 9/2019 | Park .................... H01L 27/3258 |
| 2019/0296097 A1* | 9/2019 | Hong .................. H01L 27/3262 |
| 2019/0355799 A1 | 11/2019 | Jeong et al. |
| 2020/0051964 A1 | 2/2020 | Jung et al. |
| 2020/0127220 A1 | 4/2020 | Kim et al. |
| 2020/0212117 A1 | 7/2020 | Jeon et al. |
| 2021/0134916 A1* | 5/2021 | Lee .................... H01L 27/3248 |
| 2021/0135154 A1 | 5/2021 | Liu et al. |
| 2022/0157923 A1 | 5/2022 | Zhao |

FOREIGN PATENT DOCUMENTS

| | | | | |
|---|---|---|---|---|
| CN | 102683424 A | 9/2012 | | |
| CN | 107482036 A | 12/2017 | | |
| CN | 108878486 A | * 11/2018 | ......... | H01L 27/1218 |
| CN | 110494985 A | 11/2019 | | |
| CN | 110504276 A | 11/2019 | | |
| CN | 110634937 A | 12/2019 | | |
| CN | 110828510 A | 2/2020 | | |
| CN | 111092102 A | 5/2020 | | |
| CN | 111384078 A | 7/2020 | | |
| CN | 111415969 A | 7/2020 | | |
| CN | 111430412 A | 7/2020 | | |
| KR | 20210054113 A | * 11/2019 | ......... | H01L 27/1218 |

OTHER PUBLICATIONS

China National Intellectual Property Administration, Decision of rejection of Chinese application No. 202010702007.3 dated Oct. 8, 2022, which is foreign counterpart application of this US application.

* cited by examiner

Providing a substrate 10, the substrate 10 including a plurality of pixel island regions A spaced apart and a plurality of bridge regions B connecting the adjacent pixel island regions A — S1

Forming thin film transistors 20 and first signal lines 30 in the pixel island regions A, and forming first connecting bridges 40 in the bridge regions B — S2

DISPLAY SUBSTRATE, PREPARATION METHOD THEREOF AND DISPLAY DEVICE

This application claims priority to Chinese Patent Application No. 202010702007.3, filed on Jul. 20, 2020 and titled "DISPLAY SUBSTRATE, PREPARATION METHOD THEREOF AND DISPLAY DEVICE," which is incorporated herein by reference in its entirety.

TECHNICAL FIELD

The present disclosure relates to the field of display technologies, and in particular, relates to a display substrate, a preparation method thereof, and a display device.

BACKGROUND

A display substrate generally includes a base substrate and a film layer disposed on the base substrate. In order to make the display substrate stretchable, it is necessary to dig holes in or provide dividing lines on the base substrate and the film layer on the base substrate, such that the display substrate forms a plurality of pixel islands distributed in an array and separated from one another, and a plurality of connecting bridges connecting the plurality of pixel islands.

The stretchable display substrate further includes signal lines extending longitudinally and transversely. The transverse signal lines are respectively electrically connected to the transverse connecting bridges in a bridge region of the base substrate and the gates of the thin film transistors in the pixel islands of the base substrate. The longitudinal signal lines are respectively electrically connected to the longitudinal connecting bridges in the bridge region of the base substrate and the sources/drains of the thin film transistors in the pixel islands of the base substrate.

SUMMARY

The present disclosure provides a display substrate, a preparation method thereof, and a display device.

In a first aspect, embodiments of the present disclosure provide a display substrate. The display substrate includes: a substrate, including a plurality of pixel island regions spaced apart and a plurality of bridge regions connecting adjacent pixel island regions; thin film transistors, disposed in the pixel island regions; first signal lines, disposed in the pixel island regions; and first connecting bridges, disposed in the bridge regions.

The first signal lines are electrically connected to gates of the thin film transistors, the first connecting bridges are connected to the first signal lines in the adjacent pixel island regions along a first direction, and the first connecting bridges and the first signal lines are disposed in the same layer as the gates of the thin film transistors.

In some embodiments, the first connecting bridge, the first signal line, and the gate have a same resistivity of 1 µOhmcm to 4 µOhmcm.

In some embodiments, the gate has a thickness of 300 nm to 500 nm along a direction perpendicular to a bearing surface of the substrate.

In some embodiments, the first connecting bridge, the first signal line, and the gate have an elongation at break of 1.5% to 3%.

In some embodiments, materials of the gate, the first signal line, and the first connecting bridge are the same.

In some embodiments, the material of the gate includes an aluminum alloy.

In some embodiments, the display substrate further includes second connecting bridges disposed in the bridge regions and second signal lines disposed in the pixel island regions.

In some embodiments, the second signal lines are electrically connected to sources/drains of the thin film transistors, the second connecting bridges are connected to the second signal lines in the adjacent pixel island regions along a second direction, the second connecting bridges and the second signal lines are disposed in the same layer as the sources/drains of the thin film transistors, and the first direction intersects the second direction.

In some embodiments, the first direction is perpendicular to the second direction.

In some embodiments, the first signal line extends along the first direction, and the second signal line extends along the second direction.

In some embodiments, the first signal line is a scanning line, and the second signal line is a data line.

In some embodiments, the thin film transistor includes an active layer, a first gate insulating layer, a first gate, a second gate insulating layer, a second gate, a dielectric layer, and a source/drain layer which are disposed on the substrate and sequentially laminated.

In some embodiments, the first connecting bridge and the first signal line are disposed in the same layer as the first gate, or the first connecting bridge and the first signal line are disposed in the same layer as the second gate.

In some embodiments, the substrate includes: a base substrate; a polyimide film layer disposed on a side of the base substrate; a first buffer layer disposed on a side of the polyimide film layer distal from the base substrate; and a second buffer layer disposed on a side of the first buffer layer distal from the polyimide film layer.

In some embodiments, the active layer is disposed on a side of the second buffer layer distal from the first buffer layer.

In a second aspect, embodiments of the present disclosure further provide a display device. The display device includes the display substrate described in the first aspect and a driving module. The driving module is electrically connected to a first signal line in the display substrate and configured to provide a driving signal for the first signal line.

In a third aspect, embodiments of the present disclosure further provide a method for preparing a display substrate. The method includes: providing a substrate, the substrate comprising a plurality of pixel island regions spaced apart and a plurality of bridge regions connecting the adjacent pixel island regions; and forming thin film transistors and first signal lines in the pixel island regions, and forming first connecting bridges in the bridge regions.

The first signal lines are electrically connected to gates of the thin film transistors, the first connecting bridges are connected to the first signal lines in the adjacent pixel island regions along a first direction, and the first connecting bridges, the first signal lines and the gates of the thin film transistors are fabricated and formed by a one-time patterning process.

In some embodiments, forming the thin film transistors in the pixel island regions includes: sequentially fabricating an active layer, a first gate insulating layer, a first gate, a second gate insulating layer, a second gate, a dielectric layer, and a source/drain layer on one side of the substrate by the one-time patterning process.

In some embodiments, forming the thin film transistors and the first signal lines in the pixel island regions, and forming the first connecting bridges in the bridge regions include: forming the first connecting bridges, the first signal lines and the first gates on the base substrate by the one-time patterning process.

In some embodiments, the method further includes: forming second signal lines, second connecting bridges, and the source/drain layer on the substrate by the one-time patterning process. The second signal lines are electrically connected to sources/drains of the thin film transistors, the second connecting bridges are connected to the second signal lines in the adjacent pixel island regions along a second direction, and the first direction intersects the second direction.

In some embodiments, forming the thin film transistors and the first signal lines in the pixel island regions, and forming the first connecting bridges in the bridge regions include: forming the first connecting bridges, the first signal lines, and the second gates on the base substrate by the one-time patterning process.

In some embodiments, the method further includes: forming second signal lines, second connecting bridges, and the source/drain layer on the substrate by the one-time patterning process. The second signal lines are electrically connected to sources/drains of the thin film transistors, the second connecting bridges are connected to the second signal lines in the adjacent pixel island regions along a second direction, and the first direction intersects the second direction.

BRIEF DESCRIPTION OF THE DRAWINGS

The above and/or additional aspects and advantages of the present disclosure will become apparent and easy to understand from the following description of embodiments in conjunction with the accompanying drawings, in which.

DETAILED DESCRIPTION

Descriptions are given made in detail to the embodiments of the present disclosure, examples of which are illustrated in the accompanying drawings. The reference numbers which are the same or similar throughout the accompanying drawings represent the same or similar elements or elements with the same or similar functions. The embodiments described below with reference to the accompanying drawings are intended to be illustrative only, and are not to be construed as limitations to the present disclosure.

Figure 1:
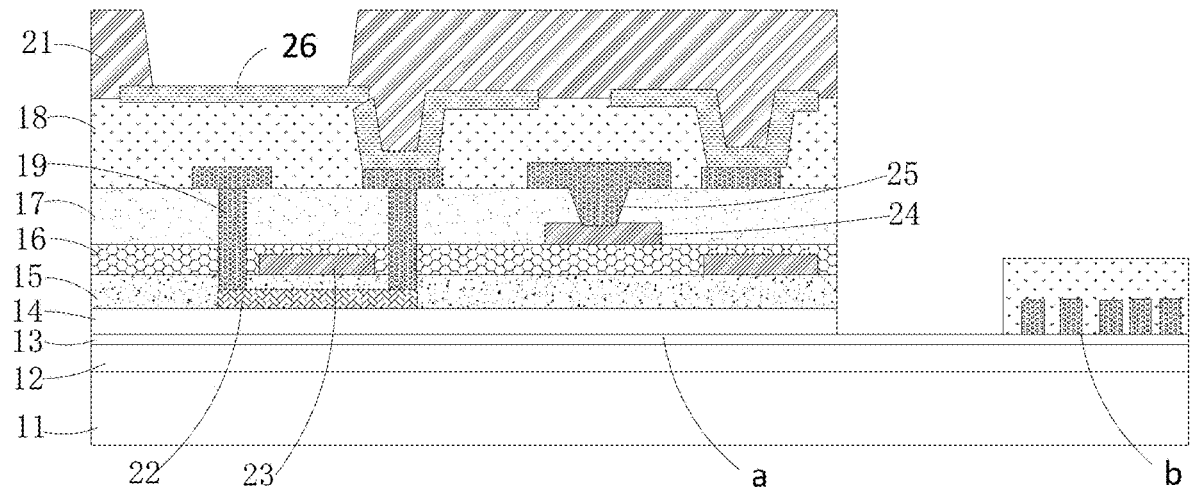
FIG. 1 is a schematic structural diagram of a display substrate in the related art.

A schematic structural diagram of a stretchable display substrate in the current related art is introduced hereinafter. As shown in FIG. 1, the stretchable display substrate includes a base substrate 11 and a polyimide film layer 12 disposed on a side of the base substrate 11, and includes a first buffer layer 13, a second buffer layer 14, an active layer 22, a first gate insulating layer 15, a first gate 23, a second gate insulating layer 16, a second gate 24, a dielectric layer 17, a source/drain 19, a planarization layer 18, an anode 26, and a pixel-defining layer 21 which are sequentially disposed on the polyimide film layer 12. In FIG. 1, a is a pixel island region of the stretchable display substrate, and a is a bridge region.

The inventors of the present disclosure have found that in the stretchable display substrates of the related art, most longitudinal signal lines and longitudinal connecting bridges are made of a source/drain metal (i.e., the same metal as the source/drain 19) and are relatively low in wiring resistance; and most transverse signal lines are made of molybdenum (generally the same material as the first gate 23 and the second gate 24), but conventional molybdenum is relatively high in resistance, such that the wiring resistance of the transverse signal lines is relatively high. Therefore, the current related art uses a metal layer arranged in the same layer as the source/drain 19 as the transverse signal lines and the transverse connecting bridges, and meanwhile, the transverse signal lines are electrically connected to the transverse connecting bridges in the bridge regions. However, since the transverse signal lines and the gates (the first gate 23 or the second gate 24) of the thin film transistors are arranged in different layers, the electrical connection with the gates must be realized through via holes, i.e., via holes 25 as shown in FIG. 1. Due to addition of the via-hole process, the width of the bridge region is reduced when the stretchable display resolution is improved, the wiring becomes denser and denser, and as a result, it is difficult to control the via-hole process.

Embodiments of the present disclosure provide a display substrate and a preparation method thereof to solve the above-mentioned problems.

The display substrate and the preparation method thereof according to the embodiments of the present disclosure are described in detail hereinafter with reference to the accompanying drawings.

Figure 2:
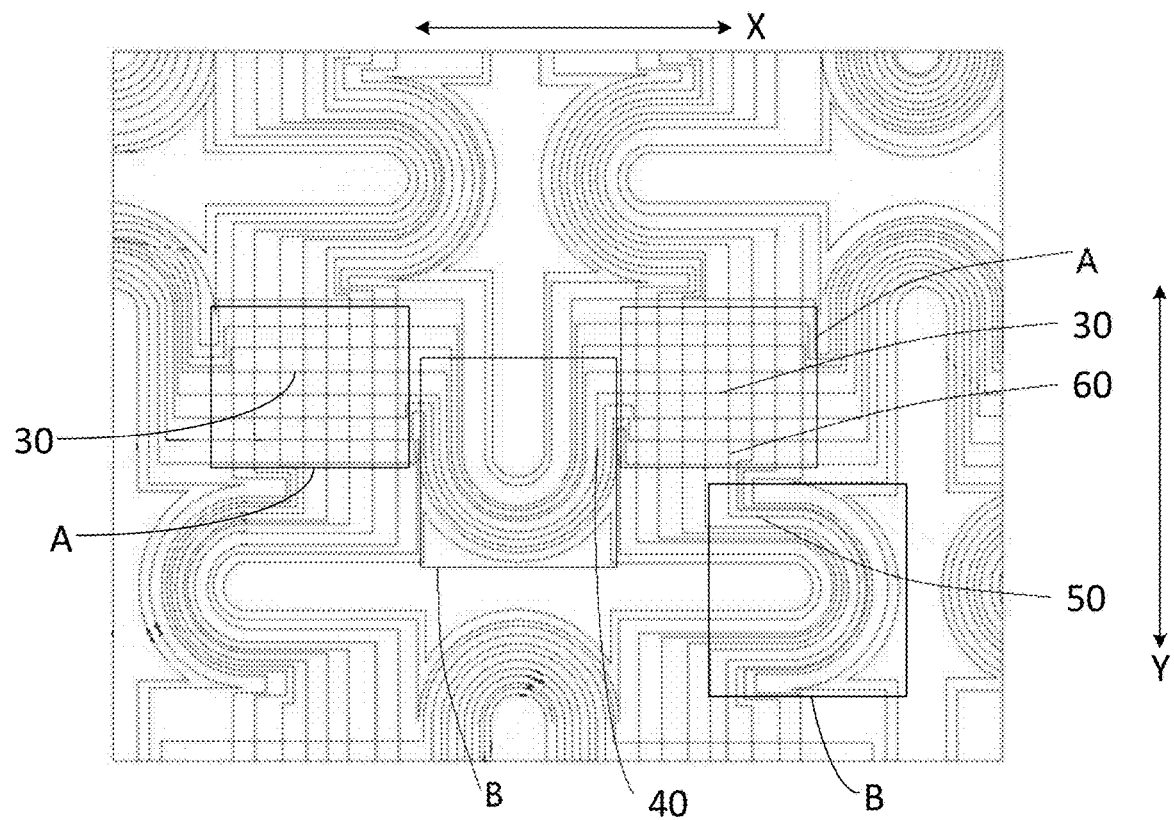
FIG. 2 is a schematic structural diagram of a display substrate according to an embodiment of the present disclosure.
Figure 3:
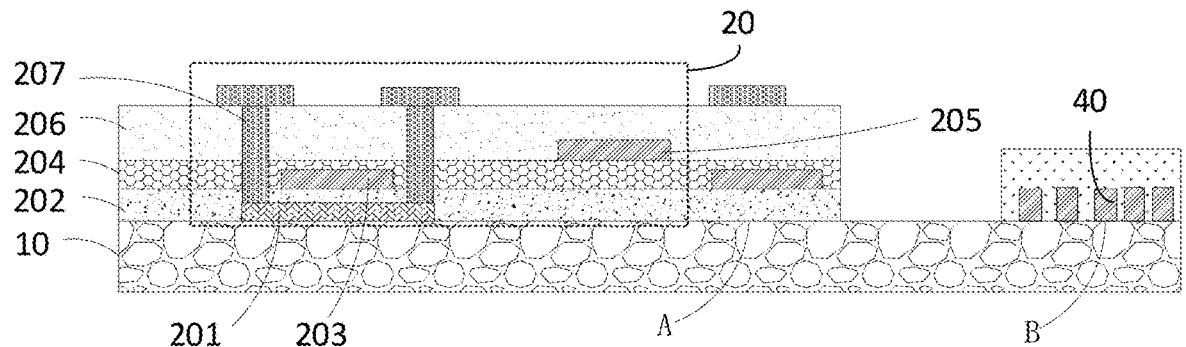
FIG. 3 is a schematic structural diagram of another display substrate according to an embodiment of the present disclosure.

As shown in FIG. 2 and FIG. 3, an embodiment of the present disclosure provides a display substrate. The display substrate includes: a substrate 10, including a plurality of pixel island regions A spaced apart and a plurality of bridge regions B connecting adjacent pixel island regions A; thin film transistors 20, disposed in the pixel island regions A; first signal lines 30, disposed in the pixel island regions A; and first connecting bridges 40, disposed in the bridge regions B included by the substrate 10.

The first signal lines 30 are electrically connected to gates of the thin film transistors 20, the first connecting bridges 40 are connected to the first signal lines 30 in the adjacent pixel island regions A along a first direction (e.g., a horizontal direction X in FIG. 2), and the first connecting bridges 40 and the first signal lines 30 are disposed in a same layer as the gates of the thin film transistors 20.

The display substrate according to this embodiment includes the plurality of pixel island regions A disposed in an array and spaced apart from each other, the plurality of bridge regions B connecting the adjacent pixel island regions A, the thin film transistors 20, the first connecting bridges 40, and the first signal lines 30. Since the first connecting bridges 40 and the first signal lines 30 are arranged in the same layer as the gates of the thin film transistors 20, a via-hole process is not required when the first signal lines 30 are electrically connected to the gates of the thin film transistors 20, thereby solving the technical problem in the related art that it is difficult to control the via-hole process when the first signal lines 30 are electrically connected to the gates of the thin film transistors 20 through via holes.

In some embodiments, the pixel island region A in this embodiment may be in any shape of, but not limited to, a circle, a triangle, a diamond, a rectangle, and a regular hexagon, and may also be designed into other shapes. In addition, one or more light-emitting units may be disposed in each pixel island region A, and each light-emitting unit may include a driving circuit structure layer and a light-emitting structure layer. A driving circuit includes a plurality of thin film transistors 20.

In some embodiments, the first signal line 30 in this embodiment may be a scanning line, and may also be called a gate line.

In some embodiments, the first connecting bridges 40 in the bridge regions B are configured to realize signal communication between the adjacent pixel island regions A. The signal communication between the adjacent pixel island regions A refers to a signal communication between the light-emitting unit in one pixel island region A and the light-emitting unit in another adjacent pixel island region A. Specifically, in this embodiment, the first connecting bridges 40 may be electrically connected to the first signal lines 30 in the adjacent pixel island regions A respectively, such that the signal communication between the adjacent pixel island regions A is realized.

In some embodiments, the first connecting bridge 40, the first signal line 30, and the gate may have the same resistivity. For example, the resistivity may be 1 μOhmcm to 4 μOhmcm, in which μOhmcm refers to micro-ohm centimeter. At present, the gate in the related art is made of molybdenum (Mo), and the connecting bridge and the signal line are made of the same material as the source/drain of the thin film transistor 20, and the resistivity of Mo is greater than 4 μOhmcm. It thus can be known that the resistance of the gate, the first connecting bridge 40, and the first signal line 30 in this embodiment is less than that of the gate, the connecting bridge, and the signal line in the related art. In this way, the wiring resistance is reduced, such that the display substrate has shorter signal delay and higher response rate.

In some embodiments, in a direction perpendicular to a bearing surface of the substrate 10, the gate may have a thickness of 300 nm to 500 nm. The gate of the thin film transistor 20, which has a thickness of less than 300 nm, is extremely high in resistance, and as a result, may not play a favorable role of effectively reducing the wiring resistance. If the gate of the thin film transistor 20 has an extremely great thickness of greater than 500 nm, the gate, and the substrate 10 are incompatible in thickness. In this embodiment, since the gate has the thickness of 300 nm to 500 nm, the wiring resistance may be reduced as much as possible on the premise of ensuring that the gate and the substrate 10 are compatible in thickness.

In some embodiments, the elongation at break of the first connecting bridge 40, the first signal line 30, and the gate may be 1.5% to 3%. Compared with the related art where the gate is made of Mo, this embodiment has the advantage that in the display substrate, since the materials selected for the first connecting bridge 40, the first signal line 30, and the gate have a prescribed elongation at break, the display substrate has a prescribed elasticity when stretched, thereby improving the stretchability of the display substrate.

In some embodiments, materials of the first connecting bridge 40, the first signal line 30, and the gate may include silver, copper, an aluminum or copper alloy, an aluminum alloy, or the like.

In some embodiments, the gate, the first signal line 30, and the first connecting bridge 40 may be made of the same material. Since the gate, the first signal line 30, and the first connecting bridge 40 are made of the same material, it is convenient to fabricate the first connecting bridge 40, the first signal line 30, and the gate in the same patterning process, such that the fabricating process is simple.

In some embodiments, the material selected for the gate is an aluminum alloy of which the resistivity is lower than that of Mo and the elongation at break is much higher than that of Mo. Therefore, the use of aluminum alloy for the gate may not only reduce the wiring resistance, but also improve the tensile property of the display substrate.

In some embodiments, as shown in FIG. 2, the display substrate may further include second connecting bridges 50 disposed in the bridge regions B, and second signal lines 60 disposed in the pixel island regions A.

In some embodiments, the second signal lines 60 are electrically connected to the sources/drains of the thin film transistors 20. The second connecting bridges 50 connect the second signal lines 60 in the adjacent pixel island regions A along a second direction (a vertical direction Y in FIG. 2). The second connecting bridges 50 and the second signal lines 60 are disposed in the same layer as the sources/drains of the thin film transistors 20. The first direction X intersects the second direction Y.

In some embodiments, referring to FIG. 2, the first direction X is perpendicular to the second direction Y.

In some embodiments, as shown in FIG. 2, the first signal line 30 may extend along the first direction X, and the second signal line 60 may extend along the second direction Y.

In some embodiments, the second connecting bridge 50 and the second signal line 60 are arranged in the same layer as the source/drain of the thin film transistor 20 and made of the same material. For example, the second signal line 60 may be a data line.

In some embodiments, taking the stretching direction of the display substrate as an example, the first direction may be a stretching direction X of the display substrate, the second direction may be a stretching direction Y of the display substrate, and the direction X is perpendicular to the direction Y.

In some embodiments, as shown in FIG. 3, the thin film transistor 20 may include an active layer 201, a first gate insulating layer 202, a first gate 203, a second gate insulating layer 204, a second gate 205, a dielectric layer 206, and a source/drain layer 207 which are sequentially disposed on the substrate 10. Both the first connecting bridge 40 and the first signal line 30 are arranged in the same layer as the first gate 203; or, both the first connecting bridge 40 and the first signal line 30 are arranged in the same layer as the second gate 205.

That is, the first signal line 30 may be connected to the first gate 203, or the second gate 205.

In some embodiments, in this embodiment, the active layer 201 is disposed on a side of the substrate 10, the active layer 201 is made of amorphous silicon, and may have a thickness of 40 nm to 50 nm.

The first gate insulating layer 202 is disposed on a side of the active layer 201 distal from the substrate 10. An orthographic projection of the first gate insulating layer 202 on the substrate 10 covers an orthographic projection of the active layer 201 on the substrate 10. In addition, the first gate insulating layer 202 may be made of silicon oxide, and may have a thickness of 100 nm to 200 nm.

The first gate 203 is disposed on a side of the first gate insulating layer 202 distal from the substrate 10. The first gate 203 may be made of an aluminum alloy, and may have a thickness of 300 nm to 500 nm.

The second gate insulating layer 204 is disposed on the side of the first gate insulating layer 202 distal from the substrate 10. The second gate insulating layer 204 may be made of silicon nitride, and may have a thickness of 100 nm to 200 nm.

The second gate 205 is disposed on a side of the second gate insulating layer 204 distal from the substrate 10. The second gate 205 may be made of aluminum alloy, and may have a thickness of 300 nm to 500 nm.

The dielectric layer 206 is disposed on a side of the second grid 205 distal from the substrate 10, and an orthographic projection of the dielectric layer 206 on the substrate 10 covers an orthographic projection of the second gate 205 on the substrate 10. In addition, the dielectric layer 206 may be made of silicon nitride, and may have a thickness of 100 nm to 300 nm.

The source/drain 207 is connected to the active layer 201 through via holes that penetrate the dielectric layer 206, the second gate insulating layer 204, and the first gate insulating layer 202. Optionally, the source/drain 207 may include titanium, aluminum, and titanium stacked in sequence, with thicknesses of 50 nm to 100 nm, 300 nm to 500 nm, and 50 nm to 100 nm respectively.

Figure 4:
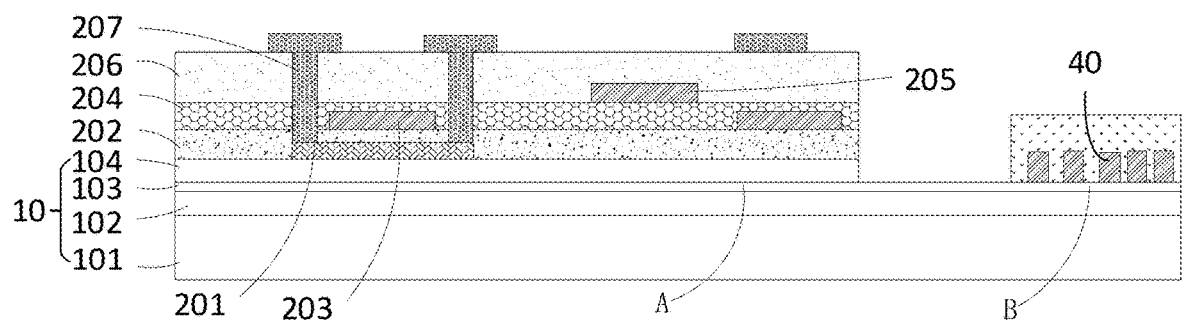
FIG. 4 is a schematic structural diagram of yet another display substrate according to an embodiment of the present disclosure.

In some embodiments, as shown in FIG. 4, the substrate 10 in this embodiment may include: a base substrate 101; a polyimide film layer 102 disposed on a side of the base substrate 101 proximal to an active layer 201; a first buffer layer 103 disposed on a side of the polyimide film layer 102 distal from the base substrate 101; and a second buffer layer 104 disposed on a side of the first buffer layer 103 distal from the polyimide film layer 102.

In some embodiments, the active layer 201 is disposed on a side of the second buffer layer 104 distal from the first buffer layer 103.

In some embodiments, the base substrate 101 may be a glass base substrate, a quartz base substrate, a resin base substrate, a flexible base substrate, or the like. The polyimide film layer 102 may have a thickness of 5 μm to 10 μm. The first buffer layer 103 may be made of silicon nitride, and may have a thickness of 100 nm to 200 nm. The second buffer layer 104 may be made by a silicon nitride and silicon oxide composite film in which a silicon nitride film may have a thickness of 50 nm to 100 nm, and a silicon oxide film may have a thickness of 200 nm to 400 nm.

Figure 5:
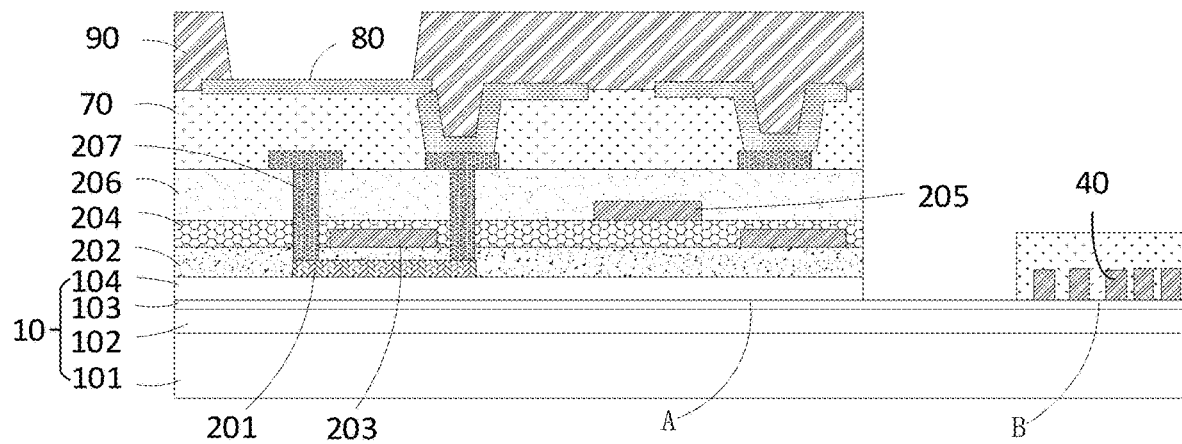
FIG. 5 is a schematic structural diagram of still another display substrate according to an embodiment of the present disclosure.

In some embodiments, as shown in FIG. 5, the display substrate in this embodiment further includes: a planarization layer 70 disposed on a side of the source/drain 207, made of polyimide and having a thickness of 2 μm to 3 μm; an anode 80 disposed on a side of the planarization layer 70 distal from the base substrate 101 and being in contact with the source/drain 207 by via holes that penetrate the planarization layer 70, wherein optionally, the anode 80 may adopt an ITO/Ag/ITO composite structure in which ITO has a thickness of 1 nm to 10 nm and an Ag film has a thickness of 50 nm to 100 nm; and a pixel-defining layer 90 disposed on a side of the anode 80 distal from the base substrate 101 and having a thickness of 2 μm to 3 μm.

Figures 6, 7:
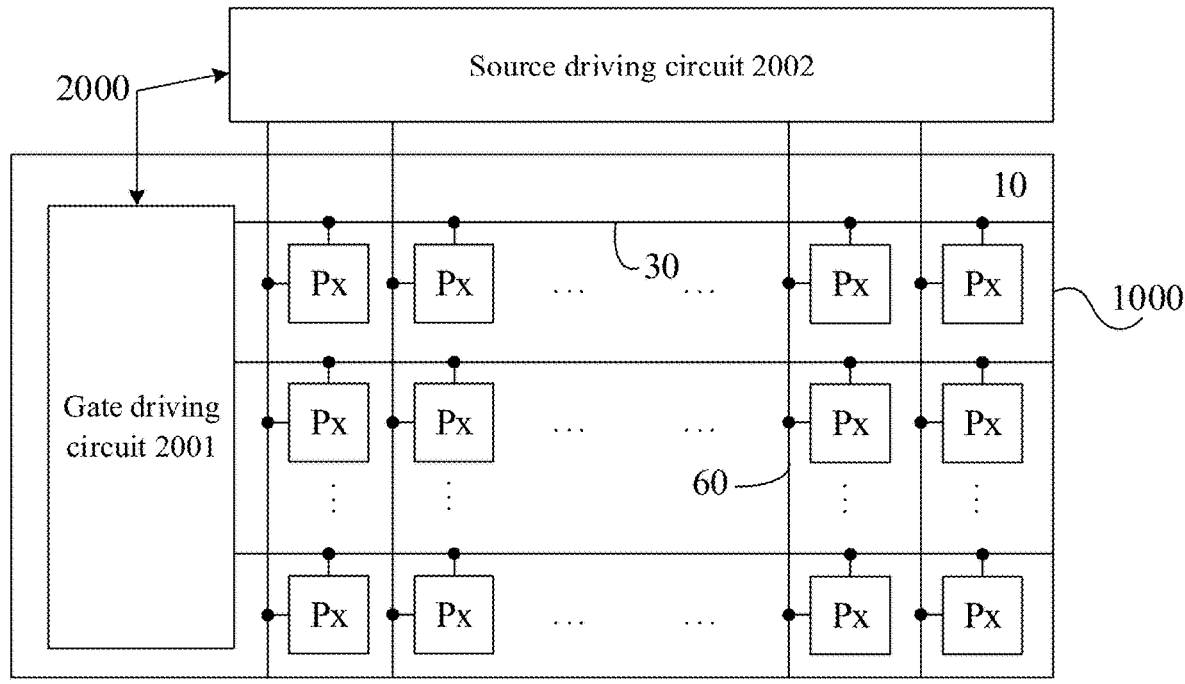
FIG. 6 is a schematic structural diagram of a display device according to an embodiment of the present disclosure.
FIG. 7 is a flow chart of a method for preparing a display substrate according to an embodiment of the present disclosure.

Based on the same inventive concept, an embodiment of the present disclosure also provides a display device. As shown in FIG. 6, the display device includes the display substrate 1000 of the foregoing embodiment and a driving module 2000. The driving module 2000 is connected to the first signal line 30 of the display substrate 1000 and configured to provide a driving signal for the first signal line 30.

In some embodiments, referring to FIG. 6, the driving circuit 2000 may include a gate driving circuit 2001 and a source driving circuit 2002. The gate driving circuit 2001 may be connected to the first signal line 30 in the display substrate 1000 and configured to provide a gate driving signal for the first signal line 30. The source driving circuit 2002 is connected to the second signal line 60 and configured to provide a data signal for the second signal line 60.

The first signal line 30 is a scanning line, and each first signal line 30 may be connected to a row of light-emitting units Px. The second signal line 60 is a data line, and each second signal line 60 may be connected to a column of light-emitting units Px.

In some embodiments, as shown in FIG. 6, the gate driving circuit 2001 may be disposed on the substrate 10 of the display substrate 1000.

Since the display device includes the display substrate, and the first connecting bridge 40 and the first signal line 30 are arranged in the same layer as the gate of the thin film transistor 20, such that a via-hole process is not required when the first signal line 30 is electrically connected to the gate of the thin film transistor 20, solving the technical problem in the related art that it is difficult to control the via-hole process when the first signal line 30 is electrically connected to the gate of the thin film transistor 20 through via holes.

Based on the same inventive concept, an embodiment of the present disclosure further provides a method for preparing a display substrate, and the method is applicable to preparing the display substrate according to the above embodiments. As shown in FIG. 7, the method includes the following steps.

In S1, a substrate 10 is provided and includes a plurality of pixel island regions A spaced apart and a plurality of bridge regions B connecting the adjacent pixel island regions A.

In S2, thin film transistors 20 and first signal lines 30 are formed in the pixel island regions A, and first connecting bridges 40 are formed in the bridge regions B.

The first signal lines 30 are electrically connected to the gates of the thin film transistors 20, the first connecting bridges 40 connect the first signal lines 30 in the adjacent pixel island regions A along a first direction, and the first signal lines 30 and the gates of the thin film transistors 20 are fabricated and formed by a one-time patterning process.

In the method for preparing the display substrate in this embodiment, the first connecting bridges 40, the first signal lines 30, and the gates of the thin film transistors 20 are arranged in the same layer, and the first connecting bridges 40, the first signal lines 30, and the gates of the thin film transistors 20 are fabricated and formed by the one-time patterning process. In this way, during the preparation, a via-hole process is not required, solving the technical problem in the related art that it is difficult to control the via-hole process when the first signal lines 30 are electrically connected to the gates of the thin film transistors 20 through via holes.

In some embodiments, as shown in FIG. 4, the substrate 10 may include a base substrate 101. The base substrate 101 may be made of such polymer materials as polyimide (PI), polycarbonate (PC), polyethersulfone (PES), polyethylene terephthalate (PET), polyethylene naphthalate (PEN), polyarylate (PAR) or glass fiber reinforced plastic (FRP).

In some embodiments, the process of forming the thin film transistors 20 on the base substrate 101 may include:

Sequentially fabricating an active layer 201, a first gate insulating layer 202, a first gate 203, a second gate insulating layer 204, a second gate 205, a dielectric layer 206, and a source/drain layer 207 on a side of the base substrate 101 by the one-time patterning process. The one-time patterning process in this embodiment may include part or all of coating, exposure, development, etching, and photoresist stripping.

In some embodiments, the process of fabricating the thin film transistors 20 in the pixel island regions A specifically includes the following steps.

As shown in FIG. 5, first, the base substrate 101 is initially cleaned, and one side of the base substrate 101 is coated with a double-layer polyimide (PI) adhesive which is cured at 30° C. to 400° C. to form a polyimide film layer having a thickness of about 10 μm.

Next, a first buffer layer 103 and a second buffer layer 104 are prepared by deposition using a plasma enhanced chemical vapor deposition (PECVD) method on a side of the polyimide film layer distal from the base substrate 101. Specifically, a silicon nitride layer of 50 nm to 300 nm may be deposited first, and then a silicon dioxide layer of 100 nm to 300 nm may be deposited.

After that, an amorphous silicon layer is deposited on a side of the second buffer layer 104 distal from the first buffer layer 103. After the deposition of the amorphous silicon layer is completed, the amorphous silicon layer is heated for 0.5-3 hours at 400° C. Afterwards, excimer laser annealing (ELA) treatment is performed on the amorphous silicon layer, and the amorphous silicon layer subjected to the excimer laser annealing treatment is patterned to form an active layer 201.

Next, on a side of the active layer 201 distal from the base substrate 101, the PECVD method is adopt for deposition to prepare the first gate insulating layer 202, and an orthographic projection of the first gate insulating layer 202 on the substrate 10 covers an orthographic projection of the active layer 201 on the substrate 10. For example, a silicon oxide layer of 400 nm to 1000 nm may be deposited first, and then a silicon nitride layer of 100 nm to 500 nm may be deposited, to obtain the first gate insulating layer 202.

Subsequently, on a side of the first gate insulating layer 202 distal from the base substrate 101, an aluminum alloy film layer is deposited by a plasma sputter deposition method, and subjected to the one-time patterning process so as to prepare the first gate 203.

Subsequently, the second gate insulating layer 204 is prepared by the PECVD method on a side of the first gate insulating layer 202 distal from the base substrate 101.

Subsequently, the aluminum alloy film layer is deposited by the plasma sputter deposition method on a side of the second gate insulating layer 204 distal from the base substrate 101, and subjected to the one-time patterning process so as to prepare the second gate 205.

Subsequently, the PECVD method is adopted to prepare the dielectric layer 206 on a side of the second gate 205 distal from the base substrate 101, and the one-time patterning process is adopted to form via holes that penetrate the dielectric layer 206, the second gate insulating layer 204, and the first gate insulating layer 202.

Finally, a metal layer is deposited on a side of the dielectric layer 206 distal from the base substrate 101 and subjected to the one-time patterning process so as to prepare the source/drain layer 207. The source/drain layer 207 is connected to the active layer 201 through the via holes.

It can be understood that after fabrication of the thin film transistor 20 is completed in this embodiment, fabrications of the anode 80 and the pixel-defining layer 90 are further included to complete fabrication of the entire display substrate. Such film layers as the anode 80 and the pixel-defining layer 90 are specifically fabricated similarly to the related art, which is not repeated herein.

In some embodiments, the display substrate may further include the second connecting bridges 50 disposed in the bridge regions B, and the second signal lines 60 disposed in the pixel island regions A, as shown in FIG. 2 for details. The first signal lines 30 may extend along a first direction, the second signal lines 60 may extend along a second direction, and the first direction may be perpendicular to the second direction.

In some embodiments, S2 may include the following sub-steps.

In S21a, the first connecting bridge 40, the first signal line 30, and the first gate 203 are formed on the substrate 10 by the one-time patterning process.

In S22a, the second signal line 60, the second connecting bridge 50, and the source/drain layer 207 are formed on the substrate 10 by the one-time patterning process.

The second signal line 60 is electrically connected to the source/drain of the thin film transistor 20, the second connecting bridge 50 is connected to the second signal line 60 in the adjacent pixel island region A along the second direction, and the first direction intersects the second direction. For example, the first direction is perpendicular to the second direction.

It can be understood that in the prepared display substrate of this embodiment, the first connecting bridge 40 is electrically connected to the first signal line 30, and both the first connecting bridge 40 and the first signal line 30 are arranged in the same layer as the first gate 203; and the second connecting bridge 50 is electrically connected to the second signal line 60, and the second signal line 60, the second connecting bridge 50, and the source/drain layer 207 are arranged in the same layer.

In some embodiments, S2 may include the following sub-steps.

In S21b, the first connecting bridge 40, the first signal line 30, and the second gate 205 are formed on the substrate 10 by the one-time patterning process.

In S22b, the second signal line 60, the second connecting bridge 50, and the source/drain layer 207 are formed on the substrate 10 by the one-time patterning process.

The second signal line 60 is electrically connected to the source/drain of the thin film transistor 20, and the second connecting bridge 207 is connected to the second signal line 60 in the adjacent pixel island region A along the second direction, and the first direction intersects the second direction. For example, the first direction is perpendicular to the second direction.

It can be understood that in the prepared display substrate of this embodiment, the first connecting bridge 40 is electrically connected to the first signal line 30, and both the first connecting bridge 40 and the first signal line 30 are arranged in the same layer as the second gate 205; and the second connecting bridge 50 is electrically connected to the second signal line 60, and the second signal line 60, the second connecting bridge 50, and the source/drain layer 207 are arranged in the same layer.

In summary, the display substrate, the preparation method thereof, and the display device according to the present disclosure have the following beneficial effects.

1. The display substrate according to the embodiments of the present disclosure includes the plurality of pixel island regions distributed in an array and separated from one another, the plurality of bridge regions connecting the adjacent pixel island regions, the thin film transistors, the first connecting bridges and the first signal lines. Since the first connecting bridges and the first signal lines are arranged in the same layer as the gates of the thin film transistors, a via-hole process is not required when the first signal lines are electrically connected to the gates of the thin film transistors, solving the technical problem in the related art that it is difficult to control the via-hole process when the first signal lines are electrically connected to the gates of the thin film transistors through via holes.

2. In the display substrate according to the embodiments of the present disclosure, the first connecting bridge, the first signal line, and the gate have the same resistivity of 1 μOhmcm to 4 μOhmcm. However, the gate in the current related art is made of molybdenum (Mo), and the connecting bridge and the signal line are made of the same material as the source/drain of the thin film transistor, and the resistivity of Mo is greater than 4 μOhmcm. That is, the resistance of the gate, the first connecting bridge, and the first signal line in this embodiment is less than that of the gate, the connecting bridge, and the signal line in the related art. In this way, the wiring resistance is reduced, such that the display substrate has shorter signal delay and higher response rate.

3. In the display substrate according to the embodiments of the present disclosure, in the direction perpendicular to the bearing surface of the substrate, the gate has a thickness of 300 nm to 500 nm. Specifically, the gate of the thin film transistor, which has a thickness of less than 300 nm, is extremely high in resistance, and as a result, may not play a favorable role of effectively reducing the wiring resistance. If the gate of the thin film transistor has an extremely great thickness of greater than 500 nm, the gate and the substrate are incompatible in thickness.

4. In the display substrate according to the embodiments of the present disclosure, the elongation at break of the first connecting bridge, the first signal line, and the gate may be 1.5% to 3%. Compared with the related art that the gate is made of Mo, this embodiment has the advantage that the display substrate has a prescribed elasticity when stretched, thereby improving the stretchability of the display substrate.

5. In the display substrate according to the embodiments of the present disclosure, the material selected for the gate is aluminum alloy of which the resistivity is lower than that of Mo and the elongation at break is much higher than that of Mo. Therefore, the use of aluminum alloy for the gate may not only reduce the wiring resistance, but also improve the tensile property of the display substrate.

6. In the method for preparing the display substrate according to the embodiments of the present disclosure, the first connecting bridge, the first signal line, and the gate of the thin film transistor are arranged in the same layer. Since the first connecting bridge, the first signal line, and the gate of the thin film transistor are fabricated and formed by the one-time patterning process, a via-hole process is not required during the preparation, solving the technical problem in the related art that it is difficult to control the via-hole process when the first signal lines are electrically connected to the gates of the thin film transistors through via holes.

It can be understood by those skilled in the art that the singular forms "a," "an," "the," and "said" may also encompass plural forms, unless otherwise stated. It should be further understood that the expression "include" used in the description of the present disclosure means there exists a feature, an integer, a step, an operation, an element and/or a component, but could not preclude existing or adding of one or more other features, integers, steps, operations, elements, components and/or groups thereof. It should be understood that when we refer to an element as being "connected" or "coupled" to another element, it can be directly connected or coupled to the another element, or an intermediate element can be present. Besides, "connected" or "coupled" as used herein may include either a wireless connection or a wireless coupling. The expression "and/or" as used herein includes all or any one and all combinations of one or more of relevant listed items.

Those skilled in the art will appreciate that all terms (including technical and scientific terms) as used herein have the same meanings as commonly understood by those of ordinary skill in the art of the present disclosure, unless otherwise defined. It also should be understood that terms such as those defined in the general dictionary should be understood to have the meanings consistent with the meanings in the context of the related art, and will not be interpreted in an idealized or overly formal meaning unless specifically defined as herein.

It can be understood by those skilled in the art that steps, measures and solutions in various operations, methods and processes discussed in the present disclosure may be alternated, modified, combined, or deleted. Further, other steps, measures, and solutions, with the various operations, methods and processes discussed in the present disclosure, may also be alternated, modified, rearranged, resolved, combined, or deleted. Further, steps, measures, and solutions in the related art, with the various operations, methods and processes discussed in the present disclosure, may also be alternated, modified, rearranged, resolved, combined, or deleted.

The above embodiments merely represent part of embodiments of the present disclosure. It should be noted that those of ordinary skill can make some improvements and modifications without departing from the principle of the present disclosure, and the improvements and modifications shall be included into the protection scope of the present disclosure.

What is claimed is:

1. A display substrate, comprising:
a substrate, comprising a plurality of pixel island regions spaced apart and a plurality of bridge regions connecting adjacent pixel island regions;
thin film transistors, disposed in the pixel island regions, wherein the thin film transistors comprise an active layer, a first gate insulating layer, a first gate, a second gate insulating layer, a second gate, a dielectric layer, and a source/drain layer which are disposed on the substrate and sequentially laminated;
first signal lines, disposed in the pixel island regions; and
first connecting bridges, disposed in the bridge regions;
wherein the first signal lines are electrically connected to the first or second gates of the thin film transistors, the first connecting bridges are connected to the first signal lines in the adjacent pixel island regions along a first direction, and the first connecting bridges and the first signal lines are disposed in a same layer as the gates of the thin film transistors;
the first signal lines extends along the first direction, the first connecting bridges, the first signal lines, and the gate are all made of an aluminum alloy and have an elongation at break of 1.5% to 3%, and the first and second gates have a thickness of 300 nm to 500 nm along a direction perpendicular to the bearing surface of the substrate; and the display substrate further comprises second connecting bridges disposed in the bridge regions and second signal lines disposed in the pixel island regions, wherein the second signal lines are electrically connected to the sources/drains of the thin film transistors and extend along the second direction; the second connecting bridges are electrically connected to the second signal lines in the adjacent pixel island regions along the second direction; both the second connecting bridges and the second signal lines are disposed in the same layer as the sources/drains of the thin film transistors; and the first direction is perpendicular to the second direction.

2. The display substrate according to claim 1, wherein the first connecting bridges, the first signal lines, and the first and second gates have a same resistivity.

3. The display substrate according to claim 2, wherein the resistivity is 1 μOhmcm to 4 μOhmcm.

4. The display substrate according to claim 1, further comprising second connecting bridges disposed in the bridge regions and second signal lines disposed in the pixel island regions;

wherein the second signal lines are electrically connected to sources/drains of the thin film transistors, the second connecting bridges are connected to the second signal lines in the adjacent pixel island regions along a second direction, the second connecting bridges and the second signal lines are disposed in the same layer as the sources/drains of the thin film transistors, and the first direction intersects the second direction.

5. The display substrate according to claim 4, wherein the first direction is perpendicular to the second direction.

6. The display substrate according to claim 4, wherein the first signal line extends along the first direction, and the second signal line extends along the second direction.

7. The display substrate according to claim 4, wherein the first signal lines are scanning lines, and the second signal lines are data lines.

8. The display substrate according to claim 1, wherein the first connecting bridge and the first signal line are disposed in a same layer as the first gate, or the first connecting bridge and the first signal line are disposed in a same layer as the second gate.

9. The display substrate according to claim 8, comprising:
a base substrate;
a polyimide film layer disposed on a side of the base substrate;
a first buffer layer disposed on a side of the polyimide film layer distal from the base substrate; and a second buffer layer disposed on a side of the first buffer layer distal from the polyimide film layer;
wherein the active layer is disposed on a side of the second buffer layer distal from the first buffer layer.

10. A display device, comprising a display substrate and a driving module, wherein the display substrate comprises a substrate, thin film transistors, first signal lines, and first connecting bridges; wherein the substrate comprises a plurality of pixel island regions spaced apart and a plurality of bridge regions connecting adjacent pixel island regions, the thin film transistors are disposed in the pixel island regions, and the thin film transistors comprise an active layer, a first gate insulating layer, a first gate, a second gate insulating layer, a second gate, a dielectric layer, and a source/drain layer which are disposed on the substrate and sequentially laminated, the first signal lines are disposed in the pixel island regions, the first connecting bridges are disposed in the bridge regions, the first signal lines are electrically connected to first or second gates of the thin film transistors, the first connecting bridges are connected to the first signal lines in the adjacent pixel island regions along a first direction, and the first connecting bridges and the first signal lines are disposed in the same layer as the first and second gates of the thin film transistors; the first signal lines extends along the first direction, the first connecting bridges, the first signal lines, and the first and second gates are all made of an aluminum alloy and have an elongation at break of 1.5% to 3%, and the first and second gates has a thickness of 300 nm to 500 nm along a direction perpendicular to the bearing surface of the substrate; and the display substrate further comprises second connecting bridges disposed in the bridge regions and second signal lines disposed in the pixel island regions, wherein the second signal lines are electrically connected to the sources/drains of the thin film transistors and extend along the second direction; the second connecting bridges are electrically connected to the second signal lines in the adjacent pixel island regions along the second direction; both the second connecting bridges and the second signal lines are disposed in the same layer as the sources/drains of the thin film transistors; and the first direction is perpendicular to the second direction; and the driving module is electrically connected to the first signal lines and configured to provide a driving signal for the first signal lines.

11. The display device according to claim 10, wherein the first connecting bridges, the first signal lines and the first and second gates have the same resistivity of 1 μOhmcm to 4 μOhmcm.

* * * * *